United States Patent [19]

Abe et al.

[11] Patent Number: 5,152,697
[45] Date of Patent: Oct. 6, 1992

[54] CONNECTOR APPARATUS FOR IC PACKAGES

[75] Inventors: Hiroshi Abe, Yokohama; Hiroshi Narita, Tokyo; Ryosuke Takahashi, Kawasaki, all of Japan

[73] Assignee: E. I. Du Pont de Nemours and Company, Wilmington, Del.

[21] Appl. No.: 747,020

[22] Filed: Aug. 19, 1991

[30] Foreign Application Priority Data

Aug. 31, 1990 [JP] Japan ................................ 2-90772[U]

[51] Int. Cl.⁵ ............................................. H01R 13/00
[52] U.S. Cl. ................................................... 439/152
[58] Field of Search ............................... 439/152-160

[56] References Cited

U.S. PATENT DOCUMENTS

| | | | |
|---|---|---|---|
| 4,740,164 | 4/1988 | Schulz et al. | 439/152 |
| 4,780,792 | 10/1988 | Harris et al. | 439/152 |
| 4,941,865 | 7/1990 | Lasmayoux et al. | 439/152 |
| 5,011,420 | 4/1991 | Sakamoto | 439/152 |

*Primary Examiner*—Joseph H. McGlynn

[57] ABSTRACT

A connector apparatus for receiving and ejecting a memory card which is connected to a electronic device, includes an ejection lever being able to slide on a surface of a housing plate for pulling out and disconnect the memory card from connecting pins by hooking at an edge of the memory card, and a rotating axis for enabling the ejection lever to swing on the surface of housing plate and holding the ejection lever rotatable through the housing plate by sliding contact within an internal surface of tubular projection of the lever.

5 Claims, 3 Drawing Sheets

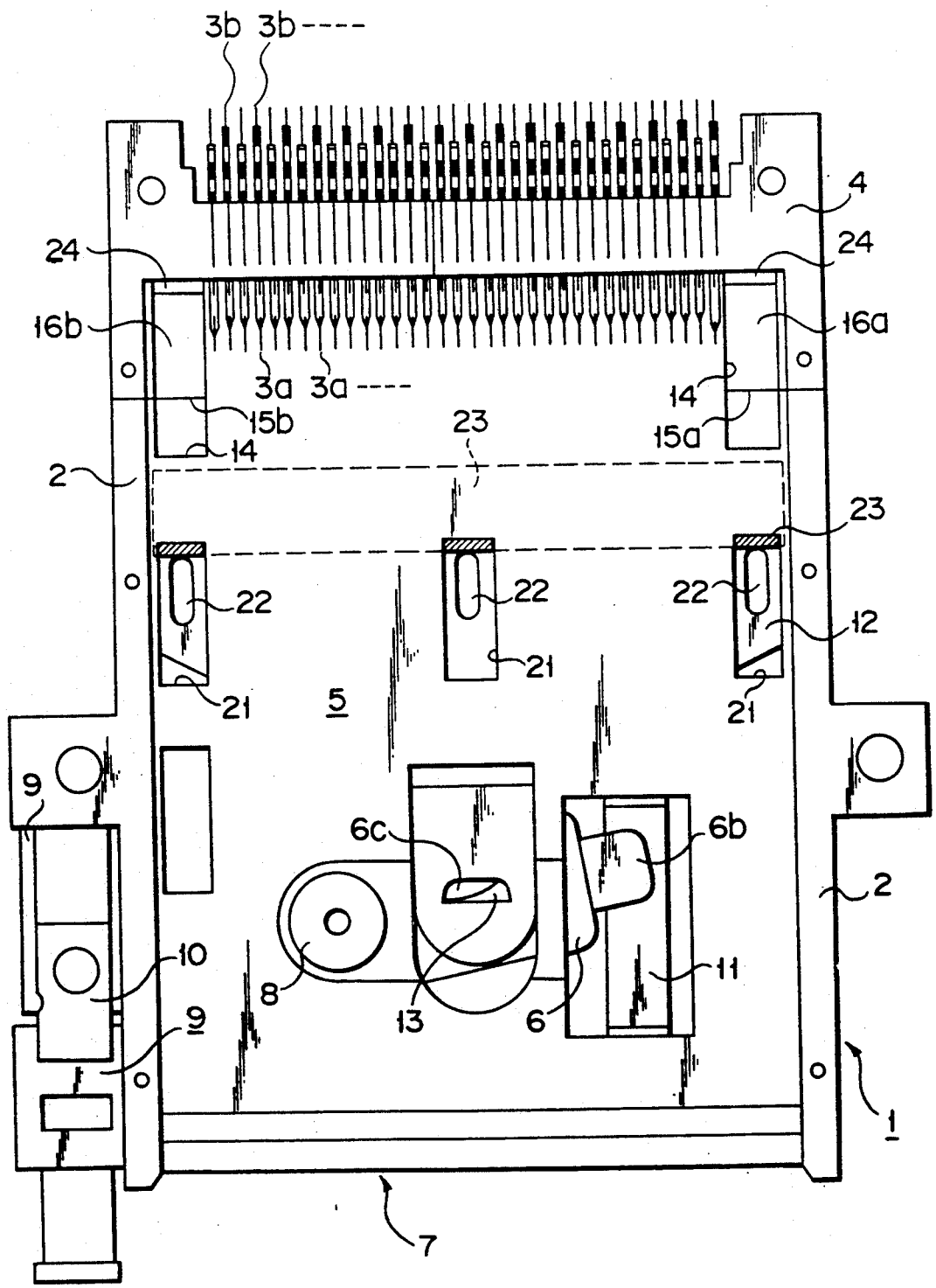
F I G. 1

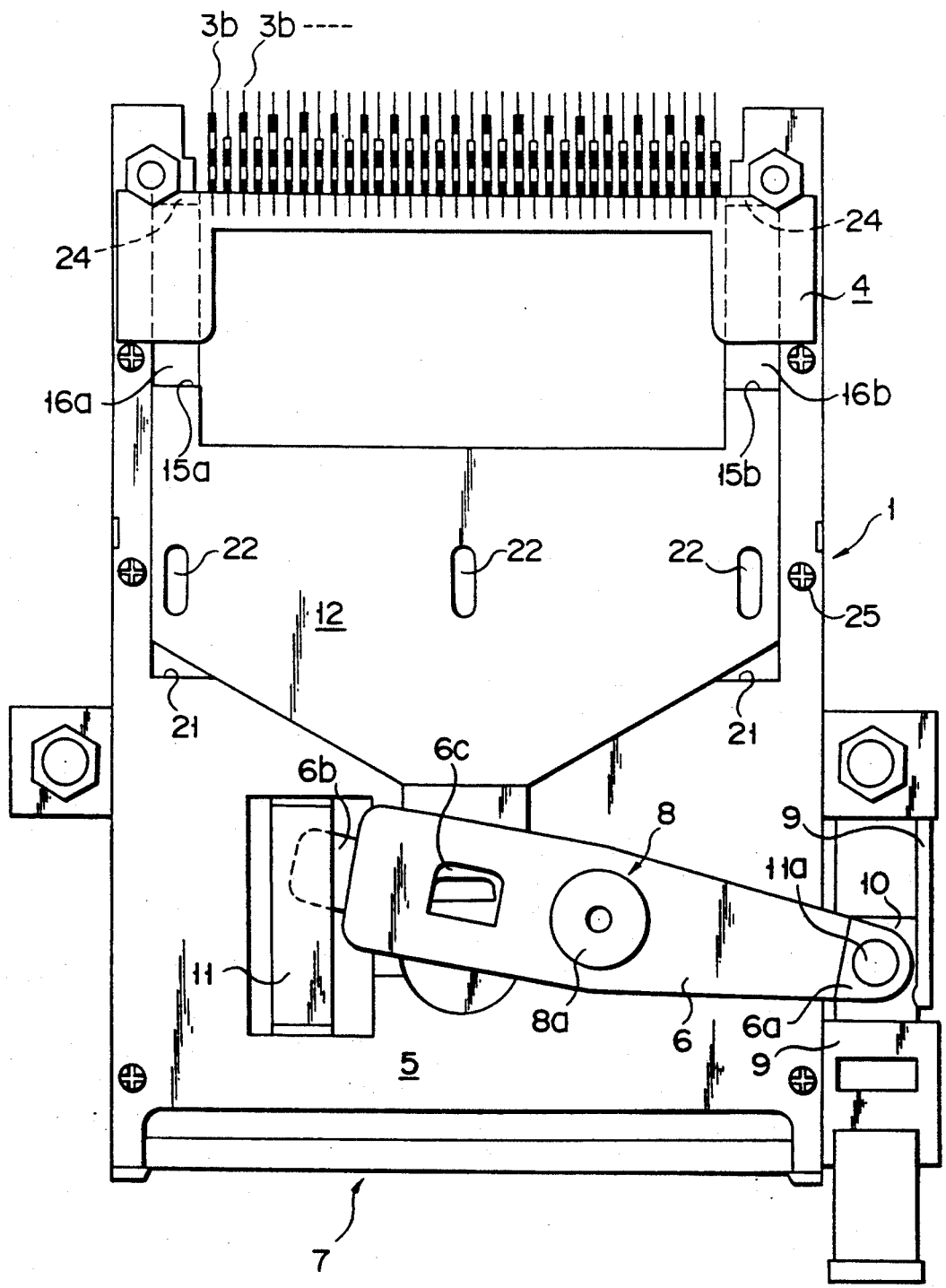
F I G. 2

CONNECTOR APPARATUS FOR IC PACKAGES

Background of the Invention

1. Field of the Invention

This invention relates to a connector apparatus for IC Packages, more particularly, to a connector apparatus for receiving and ejecting a memory card which is connected to CPU, DMA, or the like, in a electronic device for reading out data stored in the Package to perform predetermined tasks.

2. Description of the Related Art

In an electronic device, such as a microcomputer, it has been common practice to mount an IC package, such as a memory card, in an electronic device body, if necessary, in an electrically connected fashion so as to accomplish, for example, an extended application. For this purpose, a connector apparatus has been used in the art.

The conventional connector apparatus for an IC package is of such a type that it has a substantially U-shaped frame with a pair of guide grooves provided on its inner side frame portions and a connector section provided as a connection frame portion between the side frame portions and, in use, a plate-like IC package is inserted via an access hole into the device space, while being guided along the guide grooves, and held there with its widewise array of socket terminals electrically connected to an associated pin terminal array of the connector section.

In the connector apparatus as set out above, an eject mechanism is provided which, when the package is not in use, electrically disconnects the package from the device body. The eject mechanism is so operated that it is rotated around its fulcrum to cause an engaging hook means which is provided on the forward end of the plate-like member to engage with the forward end edge of the package whereby it is possible to eject the package out of a storage site.

In a recent trend toward accomplishing a thin, lightweight compact electronic device, there has also been unending demand for a corresponding compact device per set which receives IC package into its storage space and holds it electrically connected with the electronic device.

In this type of connector apparatus for IC package, in order to prevent a deformation at the engaging hook means of the forward end of the lever member due to a load involved there, the lever member has to be thickened and, further, a strong structure needs to be achieved at the fulcrum site, failing to obtain a compact device. It is thus not possible to make the device thinner in the direction of the thickness of the package.

SUMMARY OF THE INVENTION

It is accordingly the object of the present invention to provide a connector apparatus for IC package, which can be obtained as a thin, lightweight compact unit, while being made closely equal to the dimension of the package per se and can also be obtained as a very durable unit in spite of its thin structure.

In order to achieve the object of the present invention, there is provided a connector apparatus for IC package; comprising:

a housing plate member having cutouts formed in predetermined positions;

a pair of guide frame members arranged at an interval substantially equal to a width of a plate-like IC package and to be parallel to each other on both sides of the housing plate member;

a connector section provided at one end of the guide frame member and having connecting pins to be electrically connected to the package;

a pull-out plate member slidable over a surface of the housing plate member and having engaging hooks to engage with a forward end face of the package electrically connected to the connector section via the cutouts of the housing plate member; and an ejection arm/lever rotatably journaled over the surface of the housing plate member and coupled at one end to the pull-out plate.

According to the present invention, when the ejection lever is rotated with a journaling structure as a center, the lever coupled at one end to the pull-out plate is slidably moved over the surface of the housing plate member. When this occurs, the package is ejected through the engagement of the engaging hooks with the front end face of the IC package to cause the IC package to be electrically disconnected from the connector section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a plan view showing one embodiment of the present invention;

FIG. 2 is a bottom view showing the embodiment of the present invention;

DETAILED DESCRIPTION OF THE PREFERRED EMBODIMENTS

Figure 3:
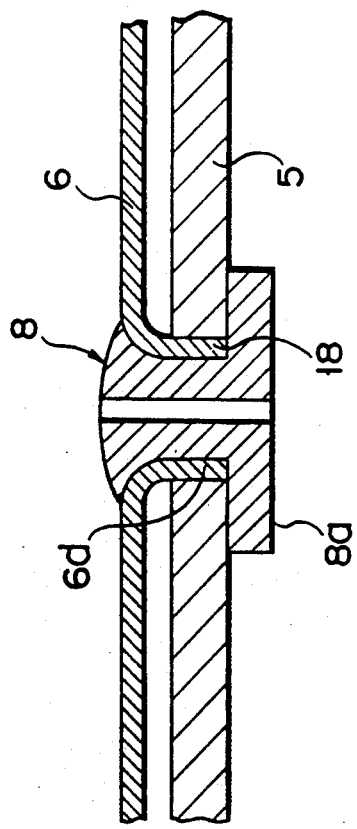
FIG. 3 is a cross-sectional view showing a shaft support section of an ejection lever in the embodiment of the present invention.

FIG. 1 is a plan view showing a connector apparatus according to one embodiment of the present invention, the arrangement shown in this figure normally corresponding to a "circuit board" side in an electronic device for reading data stored in the package.

The connector apparatus 1 comprises a pair of guide frame members 2, 2 made of a nylon, defining an interval somewhat greater than the width of IC package (memory card), not shown, and having a length substantially equal to the depth of the package and a thickness substantially equal to the thickness of the package, a connector section 4 having connecting pins 3a fitted into socket terminals provided on the package side and connecting pins 3b connected to those provided on the side of the device, and a housing plate member 5 made of a metal, fixing the guide frame member 2, 2 in place, having a later-described ejection mechanism formed on its surface, and, upon being mounted in place in the electronic device, defining a storage space of the package relative to a circuit board on the side of the device through the guide frame members 2.

FIG. 2 is a bottom view of the connector apparatus 1 as seen from the rear side as distinct from the side shown in FIG. 1, the ejection mechanism being principally shown in FIG. 2.

An ejection lever or arm 6 is made of a metal and supported by a rotating axis 8 on the lower surface side of the housing plate 5 at an area near an access hole 7 leading to the package storage space. In order to rotate the ejection lever 6 around the rotating axis 8, one end 6a of the ejection lever 6 is rotatably coupled by a rotation shaft 11a to one end of a slide member 10 which is slidably moved in a one-piece molded guide 9. A tongue 6b is provided integral with the other end of the ejection lever 6. The tongue 6b is, for example, strucked out of the housing plate 5 and located in a manner to be placed in slidable contact with the inside surface of the band-like slide guide 11 somewhat raised from the housing plate surface. Thus, the ejection lever 6 is so constructed as to be rotatable in a plane parallel to the housing plate 5. The ejection lever 6 has a raised section 6c projected toward the housing plate 5 side.

Reference numeral 12 shows a pull-out metal plate which can withdraw the package (not shown) out of electrical connection with the connector section 4 of the connector device 1 when the package is not in use. The pull-out plate 12 has an engaging claw 13, as a raised claw, at its end and engages with the raised section 6c formed on the driven side as distinct from the rotating axis (drive side) 8 for the lever 6. The pull-out metal plate is of such a type that it is slidable in a pull-out direction of the package over the housing plate 5 upon rotation of the ejection lever 6. The pull-out metal plate 12 has extending arms 16a and 16b one at each opposite side. The pull-out metal plate further has bent sections 15a, 15b in a stepped relation such that their forward ends are upwardly projected via cutouts 14, 14 provided at corresponding area of the housing plate member. Thus the package stored in the storage space of the connector device 1 has its surface placed in direct contact with the arms 16a and 16b of the pull-out plate 12. The forward ends of the arms 16a and 16b are bent to provide engaging hooks 24, 24 engaging with a socket-side end face, that is, the forward end face, of the IC package.

The package needs to be electrically shielded and, in order to achieve this, three projections 22 are provided at corresponding places, by an extrusion molding method, in the middle portion of the pull-out metal plate (conductive plate) such that they are projected toward the storage space side via through holes 21 provided at the corresponding areas of the housing plate 5 to allow them to contact with the outer surface of the IC package inserted.

FIG. 3 is a cross-sectional view showing the shaft support section of the ejection lever 6. Since the rotation shafts 8 and 11a are of the same type, only one shaft 8 will be explained below in conjunction with FIG. 3 and explanation of the shaft 11a is, therefore, omitted.

That is, a tubular projection 6d is provided as one portion of the ejection lever 6 and made of, for example, a stainless steel. The tubular projection 6d is fitted in the bearing hole 18 provided in the housing plate 5 made of, for example, a stainless steel. The rotation shaft 8 made of a brass has a flange 8a at one side and is fitted in a center through hole provided in the tubular projection. The other side of the rotating axis is caulked to prevent the rotating axis from being slipped off the center through hole. The rotating axis is rotatable in the bearing hole 18 in accordance with the movement of the lever 6. In the arrangement shown in FIG. 3, the ejection lever 6 is repeatedly rotatable while the outer surface of the tubular projection 6d of the ejection lever 6 contacts with the inner wall surface of the bearing hole 18 of the housing plate 5. Since the housing plate 5 is made of the same material as that of the ejection level, it is possible to achieve a high wear resistance and hence to achieve a remarkably enhanced endurance at the bearing area.

The problem with the endurance of the bearing area has conventionally arised from, for example, a clearance between the rotation shaft and the insertion hole of the ejection lever due to, for example, the wear of the axis and a resultant reduction in an IC package pullout stroke length. That is, a reliability problem has been involved upon withdrawal of the package.

It has been found that the aforementioned bearing structure of the ejection lever of the connector apparatus according to the embodiment of the present invention can fully withstand about 20,000 ejection operations, a figure which is generally required in this field of art.

Figure 4:
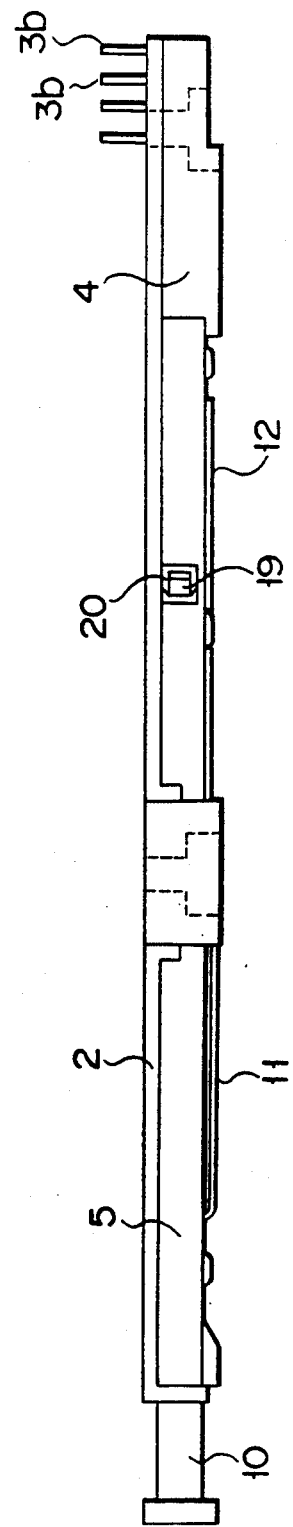
FIG. 4 is a side view showing the embodiment of the present invention.

Further, the connector apparatus of the present embodiment is of such a type that a connector section 4 can be separated from an ejection mechanism-equipped housing plate 5 side by a simpler operation. FIG. 4 is a side view showing the connector apparatus. In FIG. 4, an engaging arm, not shown, is provided integral with each side section of the connector 4 made of elastic material and an engaging projection 19 is provided on the forward end of the engaging arm. The engaging arm of the connector section 4 is inserted into a receiving section provided by both the bent side portion of the housing plate 5 and partial recess formed at the side surface of the guide frame member 2. The engaging projection 19 is fitted into the engaging hole 20 provided in the bent side surface of the housing plate 5.

The connector section can be freely and readily attached to, or detached from, the side of a connector apparatus by bringing the engaging projection 19 of the engaging arm of the connector section into and out of engagement with the engaging hole 20 provided on the guide frame member 2 side and hence the housing plate 5 side.

The guide frame member 2 is secured by screws to the housing plate 5.

When the package is mounted in the electric device according to the present invention, it is inserted into the storage space via the access 7 of the connector device 1 to fit the socket terminals of the package over the pin terminals of the connector section 4. At this time, the forward end face of the package engages with the engaging hooks 24, 24 of the pull-out metal plate 12 to move the metal plate 12 in a forward direction. As a result, the ejection lever 6 is rotated around the rotating axis 8, causing the slider member 10 to be projected.

With the package held in the storage space, the IC package is grounded through the pull-out plate 12 whose projections 22 are connected via the through holes 21 of the housing plate 5 to the package surface and then through the ejection lever 6, housing plate 5 and screws 25.

By so doing, it is only necessary that only one surface of the package, that is, only its surface facing the housing plate 5, make electrical contact with the projections 22 of the pull-out plate 12. Therefore, no particular consideration needs to be paid to the other surface of the package which faces the circuit board in the device. It is thus possible to provide a desired printed circuit pattern, for example, on that surface.

Further, since there is no intervening object between the circuit board of the device and the one surface of the package, electric contact can be made between the side of the package and the circuit board and this can be so done at any proper position with the use of a thin metal plate of, for example, a predetermined electric conductivity. It is possible to properly print a desired circuit pattern on each side of the package.

When the package is withdrawn out of the storage space, the slider member 10 is pushed, causing the ejection lever 6 to be rotated around the rotating axis 8. This rotation causes the pull-out plate 12 to be moved over the surface of the housing plate 12 along the guide frame members 22 with the raised section 6c hooked by the engaging claw 13, so that the package is withdrawn out of the storage space through the utilization of the engaging hooks 24, 24 on the forward end of the arms 16a, 16b.

In the aforementioned connector device 1, the pull-out plate 12 is freely moved over the surface of the housing plate 5 and, if a debarring process which has to be done, for example, at the edge of the punched through hole 21 of the housing plate 5 is omitted so as to lower the manufacturing cost, then there is a possibility that the contacting surface of the draw-out plate 12 will be scraped off by the burr. It is preferable that, in order to prevent the occurrence of electrical faults resulting from the drop of the metal scrapings onto the package or connector section, a plate-like covering 23 made of, for example, polyethylene be joined to that area of the draw-out plate 12 where the draw-out plate 12 is moved over the through holes of the housing plate 5.

The connector apparatus according to the present embodiment has a dimension, that is, a thickness about 1.4 times that (about 3 mm) of the package, a width corresponding to a total of the width of the package plus that of the guide frame member 2, and a depth greater than the depth of both the depth of the package and thickness of the engaging hook 24 involved upon engagement of the engaging hooks 24 with the socket-side end face of the package. It is thus possible to obtain a thin compact unit.

As will be evident from the above, the connector apparatus of the present invention can be achieved with much less number of component parts than a conventional connector apparatus for IC package of the same type. It is thus possible to make the whole outer dimension of the connector apparatus closely equal to that of the package per se and hence to provide a thin, durable compact connector apparatus.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A connector apparatus for IC packages; comprising:
   a housing plate member having cutouts formed in predetermined positions;
   a pair of guide frame members arranged at an interval substantially equal to a width of a plate-like IC package and to be parallel to each other on both sides of the housing plate member;
   a connector section provided at one end of the guide frame member and having connecting pins to be electrically connected to said package;
   a pull-out plate member slidable over a surface of the housing plate member and having engaging hooks to engage with a forward end face of said package electrically connected to the connector section via the cutouts of the housing plate member; and
   an ejection arm/lever rotatably journaled over the surface of the housing plate member and coupled at one end to the pull-out plate.

2. The connector apparatus according to claim 1, wherein a journaling structure is provided which has a rotating axis fitted inside a tubular projection formed as part of the ejection lever and inserted through a through hole in the housing plate member with a slippage preventing means provided at each end of the rotating axis to prevent a slippage of the lever off the housing plate member.

3. The connector apparatus according to claim 1 or 2, wherein a plate-like resin is joined to that area of the pull-out plate member where the Pull-out plate is moved over the cutout and through holes of the housing plate member.

4. The connector apparatus according to anyone of claim 1 or 2, wherein the guide frame member is made of a resin; the housing plate member, Pull-out plate member and ejection lever are made of a metal; and the housing plate member and ejection arm/lever are made of the same type of metal.

5. The connector apparatus according to anyone of claim 1 or 2, wherein the guide frame members are fixed by screws to the housing plate member.

* * * * *